United States Patent
Seol et al.

(10) Patent No.: US 9,904,492 B2
(45) Date of Patent: Feb. 27, 2018

(54) METHOD FOR OPERATING NON-VOLATILE MEMORY CONTROLLER

(71) Applicants: Chang-Kyu Seol, Osan-si (KR); Jun-Jin Kong, Yongin-si (KR); Hye-Jeong So, Seoul (KR); Hong-Rak Son, Anyang-si (KR); Young-Geon Yoo, Seoul (KR); Dong-Whan Lee, Namyangju-si (KR); Dong-Sup Jin, Seoul (KR)

(72) Inventors: Chang-Kyu Seol, Osan-si (KR); Jun-Jin Kong, Yongin-si (KR); Hye-Jeong So, Seoul (KR); Hong-Rak Son, Anyang-si (KR); Young-Geon Yoo, Seoul (KR); Dong-Whan Lee, Namyangju-si (KR); Dong-Sup Jin, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 15 days.

(21) Appl. No.: 15/065,915

(22) Filed: Mar. 10, 2016

(65) Prior Publication Data
US 2016/0299813 A1  Oct. 13, 2016

(30) Foreign Application Priority Data
Apr. 13, 2015  (KR) .......................... 10-2015-0051751

(51) Int. Cl.
G06F 3/06       (2006.01)
G06F 11/10      (2006.01)
(Continued)

(52) U.S. Cl.
CPC ............ *G06F 3/0679* (2013.01); *G06F 3/064* (2013.01); *G06F 3/0619* (2013.01); (Continued)

(58) Field of Classification Search
CPC ............ G06F 11/1048; G06F 11/1072; G06F 11/1012; G06F 3/0619; G06F 3/064; G06F 3/0679; G11C 16/10
See application file for complete search history.

(56) References Cited

U.S. PATENT DOCUMENTS 6,704,368 B1   3/2004  Nefedov
7,782,665 B2   8/2010  Turbanti et al.
(Continued)

*Primary Examiner* — Shelly A Chase
(74) *Attorney, Agent, or Firm* — Volentine & Whitt, PLLC

(57) ABSTRACT

Provided are methods for operating a non-volatile memory controller. A method for operating a non-volatile memory controller includes dividing data provided from a host into first unit data and second unit data, encoding the first unit data into first codewords including n number of bits (n is an integer equal to or more than 1), encoding the second unit data into second codewords including n-w number of bits (w is an integer less than n and equal to or more than 1) corresponding to a bit having a value of 0 among the n number of bits of the first codewords, performing bit-to-state mapping on the first codewords and the second codewords using a predetermined bitmap, and programming the first codewords and the second codewords to a first page and a second page of a non-volatile memory, respectively.

17 Claims, 15 Drawing Sheets

(51) Int. Cl.
  *G11C 11/56* (2006.01)
  *G11C 29/04* (2006.01)
(52) U.S. Cl.
  CPC ...... *G06F 11/1072* (2013.01); *G11C 11/5628* (2013.01); *G11C 11/5642* (2013.01); *G11C 2029/0411* (2013.01)

(56) References Cited

U.S. PATENT DOCUMENTS

| | | |
|---|---|---|
| 7,823,043 B2 | 10/2010 | Lasser |
| 7,823,052 B2 | 10/2010 | Yu et al. |
| 8,086,931 B2 | 12/2011 | Litsyn et al. |
| 8,190,968 B2 | 5/2012 | Lee et al. |
| 8,327,218 B2 | 12/2012 | Lee et al. |
| 8,327,246 B2 | 12/2012 | Weingarten et al. |
| 8,645,789 B2 | 2/2014 | Sharon et al. |
| 9,124,300 B2 * | 9/2015 | Sharon ................ G06F 11/1012 |
| 9,406,385 B2 * | 8/2016 | D'Abreu ................ G11C 16/10 |
| 2012/0210082 A1 | 8/2012 | Sharon et al. |
| 2014/0006898 A1 | 1/2014 | Sharon et al. |
| 2015/0067439 A1 * | 3/2015 | Yamaki ............... G06F 11/1012 714/758 |
| 2015/0248325 A1 * | 9/2015 | Calderbank ......... G06F 11/1048 714/768 |

* cited by examiner

US 9,904,492 B2

METHOD FOR OPERATING NON-VOLATILE MEMORY CONTROLLER

This application claims priority from Korean Patent Application No. 10-2015-0051751 filed on Apr. 13, 2015 in the Korean Intellectual Property Office, the disclosure of which is incorporated herein by reference in its entirety.

BACKGROUND

1. Field

The field of the present embodiments relates to a method for operating a non-volatile memory controller.

2. Description of the Related Art

Semiconductor memory devices are memory devices implemented using a semiconductor such as silicon (Si), germanium (Ge), gallium arsenide (GaAs), indium phosphile (InP), and the like. Semiconductor memory devices are roughly classified into volatile memory devices and non-volatile memory devices.

Volatile memory devices lose data stored therein when the power is turned off. Volatile memory devices include a static random access memory (SRAM), a dynamic random access memory (DRAM), a synchronous dynamic random access memory (SDRAM), etc. Non-volatile memory devices are capable of maintaining data stored therein even when the power is turned off. Non-volatile memory devices include a flash memory device, a Read-Only Memory (ROM), a Programmable Read-Only Memory (PROM), an Erasable Programmable Read-Only Memory (EPROM), an Electrically Erasable Programmable Read-Only Memory (EEPROM), a resistive memory device (for example, a phase-change random access memory (PRAM), a ferroelectric random access memory (FRAM), a resistive random access memory (RRAM)), and the like.

SUMMARY

An embodiment of the present inventive concept provides a method for operating a non-volatile memory controller, the method being capable of restoring data of a non-volatile memory through a read operation performed twice at the maximum.

However, embodiments of the present inventive concept are not restricted to those set forth herein. The other embodiments of the present inventive concept which are not mentioned herein will become more apparent to a person skilled in the art to which the present inventive concept pertains by referencing the detailed description of the present inventive concept given below.

According to an aspect of the present inventive concept, there is provided a method for operating a non-volatile memory controller, comprising dividing data provided from a host into first unit data and second unit data, encoding the first unit data into first codewords including n number of bits (n is an integer equal to or more than 1), encoding the second unit data into second codewords including n-w number of bits (w is an integer less than n and equal to or more than 1) corresponding to a bit having a value of 0 among the n number of bits of the first codewords, performing bit-to-state mapping on the first codewords and the second codewords using a predetermined bitmap, and programming the first codewords and the second codewords to a first page and a second page of a non-volatile memory, respectively.

According to another aspect of the present inventive concept, there is provided a method for operating a non-volatile memory controller, comprising dividing data provided from a host into first unit data and second unit data, programming the first unit data to a first page of a non-volatile memory, and programming the second unit data to a second page of the non-volatile memory, wherein the second unit data is programmed only to a position in the second page corresponding to the position of the first unit data having a value of 0 among the first unit data programmed to the first page.

DETAILED DESCRIPTION OF THE EMBODIMENTS

Figure 1:
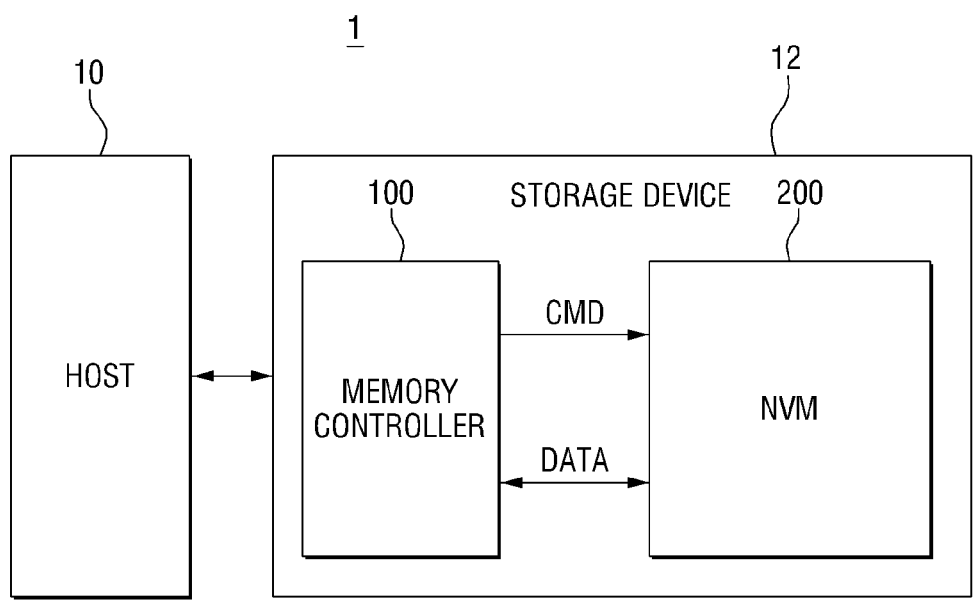
FIG. 1 is a block diagram schematically illustrating a non-volatile memory system according to an embodiment of the present inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a non-volatile memory system according to an embodiment of the present inventive concept.

Referring to FIG. 1, a non-volatile memory system 1 according to an embodiment of the present inventive concept includes a host 10 and a storage device 12, and the storage device 12 includes a memory controller (or a non-volatile memory controller) 100 and a non-volatile memory 200.

The host 10 provides data to the storage device 12, and the memory controller 100 controls overall operation of the non-volatile memory 200. The non-volatile memory 200 may perform operations of programming, reading, erasing and the like according to the control of the memory controller 100.

To this end, the non-volatile memory 200 receives, as an input, a command CMD, an address ADDR and data DATA through an input/output line. Furthermore, the non-volatile memory 200 receives power PWR as an input through a power line, and receives a control signal CTRL as an input through a control line. The control signal CTRL may include, for example, command latch enable CLE, address latch enable ALE, chip enable nCE, write enable nWE, read enable nRE, and the like.

The non-volatile memory 200 may include a flash memory, an Electrically Erasable Programmable Read-Only Memory (EEPROM), a ferroelectric random access memory (FRAM), a phase-change random access memory (PRAM), a magneto resistive random access memory (MRAM), and the like. FIG. 1 illustrates an example of a flash memory device, but the present disclosure is not limited thereto. Referring to FIG. 1, the non-volatile memory 200 may serve as a storage unit for storing data provided from the memory controller 100. The non-volatile memory 200 may include a plurality of cell arrays for storing data.

In some embodiments of the present inventive concept, the non-volatile memory 200 may be a NAND flash memory. In this case, the non-volatile memory 200 may include a plurality of planes PL1 to PLn (n is a natural number). Each plane PL1 to PLn includes a plurality of blocks BLK1 to BLKm (n is a natural number), and each block BLK1 to BLKm includes a plurality of wordlines WL1 to WLk (n is a natural number). In this case, blocks BLK1 to BLKm may be a unit for executing an erase command, that is, blocks BLK1 to BLKm may be a unit in which erase operations can be performed simultaneously.

The wordlines may be a unit for executing programming and read commands, that is, the wordlines may be a unit in which programming and read operations can be performed simultaneously. In the meantime, the plurality of blocks BLK1 to BLKm may include a three dimensional structure, in which memory cells are stacked on a substrate in a vertical direction.

As the speed of data transmission between the host 10 and the memory controller 100 via an interface increases, the speed of data transmission between the memory controller 100 and the non-volatile memory 200 via an interface also needs to be increased. To this end, random input/output (IO) needs to be efficiently performed on the data stored in the non-volatile memory 200. Specifically, to randomly read the data stored in the non-volatile memory 200, a three or four bit multi-level cell (MLC) generally requires read operations to be performed on the non-volatile memory 200 three or four times at the maximum, and thus, the speed of data transmission between the memory controller 100 and the non-volatile memory 200 via an interface may not be satisfactory. To improve such drawbacks, read operations required for randomly reading a multi-level cell memory may be restricted to twice at the maximum, thereby significantly increasing the random I/O speed for the data stored in the non-volatile memory 200.

Figure 2:
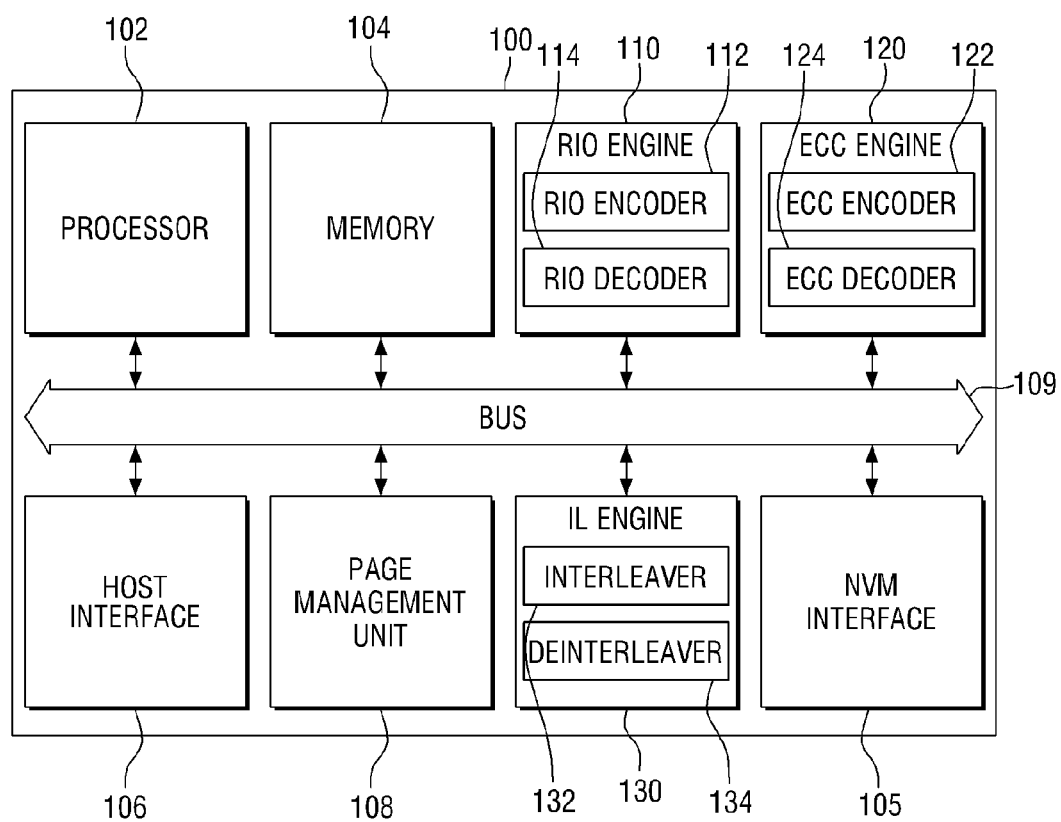
FIG. 2 is a block diagram schematically illustrating a non-volatile memory controller according to an embodiment of the present inventive concept.

FIG. 2 is a block diagram schematically illustrating a non-volatile memory controller according to an embodiment of the present inventive concept.

Referring to FIG. 2, the non-volatile memory controller 100 according to an embodiment of the present inventive concept includes a processor 102, a non-volatile memory interface 105, a host interface 106, a page management unit 108, a random I/O (RIO) engine 110, an error correction code (ECC) engine 120 and an interleaving engine 130. These components may be electrically interconnected through a bus 109.

The processor 102 controls overall operations of the storage device 12 including the memory controller 100. The processor 102 may be implemented by logic, codes or a combination thereof. When power is applied to the storage device 12, the processor 102 may drive a firmware for operation of the memory system 1 stored in the memory 104 (for example, Read-Only Memory (ROM)), thereby controlling overall operation of the storage device 12. Furthermore, the processor 102 may interpret the command applied from the host 10 and control overall operation of the non-volatile memory 200 according to the result of the interpretation. Furthermore, the processor 102 may map the logical address provided from the host 10 to a physical address corresponding to the non-volatile memory 200.

The memory 104 may include a random access memory (RAM) or a Read-Only Memory (ROM). RAM is a memory serving as a buffer, and may store an initial command, data and various variables input through the host interface 106, or data output from the non-volatile memory 200. In addition, the memory 104 may store data, various parameters and variables input and output to and from the non-volatile memory 200. In the meantime, ROM may store a driving firmware code of the storage device 12 and codes required for operating the memory controller 100. The firmware code may be stored in various non-volatile memories other than ROM.

The non-volatile memory interface 105 may perform interfacing between the memory controller 100 and the non-volatile memory 200. The command required by the processor 102 may be provided to the non-volatile memory 200 through the non-volatile memory interface 105, and data may be transmitted from the memory controller 100 to the non-volatile memory 200. Furthermore, data provided from the non-volatile memory 200 may be provided to the memory controller 100 through the non-volatile memory interface 105.

The host interface 106 may perform interfacing between storage device 12 including the memory controller 100 and the host 10 according to a predetermined protocol. The host interface 106 may communicate with the host 10 via a universal serial bus (USB), a small computer system interface (SCSI), a PCI express, ATA, parallel ATA (PATA), serial ATA (SATA), a serial attached SCSI (SAS), and the like.

The page management unit 108 may divide data provided from the host 10 into unit data. The unit data may be, for example, a page unit, an ECC encoding unit, or the like to be programmed in the non-volatile memory 200, however, the unit data is not limited to a specific size. In some embodiments of the present inventive concept, each unit data may have the same size. In some other embodiments of the present inventive concept, each unit data may have sizes different from each other.

The random I/O (RIO) engine 110 may perform random I/O operation on the data stored in the non-volatile memory 200. In some embodiments of the present inventive concept, the random I/O (RIO) engine 110 may include an RIO encoder 112 and an RIO decoder 114.

The RIO encoder 112 encodes data provided from the host 10 or data to be stored in the non-volatile memory 200 to a binary vector including one or more bits. The RIO encoder 112 encodes, for a predetermined binary vector, the aforementioned data according to a value of a parameter such as the length of the vector, the maximum number (or weight) of bit having a value of 1 from among the bits constituting the vector, and the like, to thereby generate a codeword. In some embodiments of the present inventive concept, codewords encoded by the RIO encoder 112 may be bit-to-state mapped using a predetermined bitmap and then programmed to the non-volatile memory 200.

In the meantime, the RIO decoder 114 decodes the codeword read from the non-volatile memory 200 to restore the codeword to original data. The RIO decoder 114 may decode the codeword to original data using the parameter information used by the RIO encoder 112 in encoding the codeword. The RIO engine 110 will be described in detail with reference to FIG. 3 below.

The error correction code (ECC) engine 120 performs an error bit correction. In some embodiments of the present inventive concept, the ECC engine 120 performs an error bit correction on a sector data unit basis. For example, if a page data unit is 8K byte, a sector data unit may be 1K byte. In some embodiments of the present inventive concept, the ECC engine 120 may include an ECC encoder 122 and an ECC decoder 124.

The ECC encoder 122 performs error correction encoding on the data to be provided to the non-volatile memory 200, to thereby generate an ECC codeword to which a parity bit is added. The ECC codeword may be stored in the non-volatile memory 200. The ECC encoder 122 may perform encoding on a basis of sector data which is ECC unit data.

The ECC decoder 124 performs error correction decoding on output data, determines whether the error correction decoding is successful or not based on the result of the decoding, and outputs an indication signal based on the result of the determination. The read data is transmitted to the ECC decoder 124, and the ECC decoder 124 may correct error bits of data using a parity bit. When the number of error bits is equal to or larger than a correctable error bit threshold value, the ECC decoder 124 may not correct error bits, resulting in an error correction failure.

The ECC encoder 122 and the ECC decoder 124 may perform an error correction using a coded modulation such as a low density parity check (LDPC) code, a BCH code, a turbo code, a Reed-Solomon code, a convolution code, a recursive systematic code (RSC), a trellis-coded modulation (TCM), a block coded modulation (BCM), and the like, but the present disclosure is not limited thereto. In the meantime, the ECC encoder 122 and the ECC decoder 124 may include all of a circuit, a system or a device for an error correction.

The interleaving engine 130 performs interleaving operations on the parity bit generated by the error bit correction operation of the ECC engine 120. In some embodiments of the present inventive concept, the interleaving engine 130 may include an interleaver 132 and a deinterleaver 134.

The interleaver 132 interleaves a plurality of parity data to generate interleaved data, and the deinterleaver 134 restores the interleaved data back to the plurality of parity data. This will be described in detail with reference to FIGS. 10 and 11 below.

Figure 3:
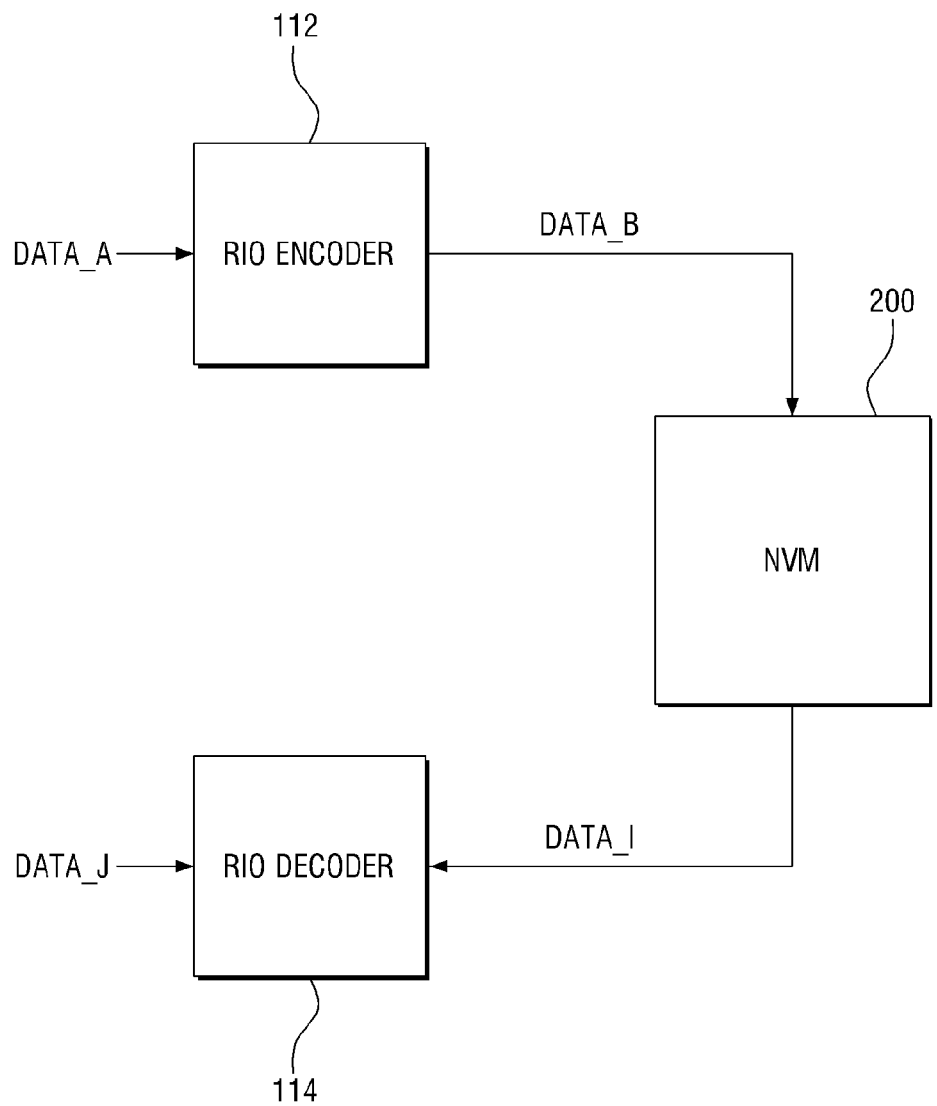
FIG. 3 is a block diagram schematically illustrating a method for operating a non-volatile memory controller according to an embodiment of the present inventive concept.

FIG. 3 is a block diagram schematically illustrating a method for operating a non-volatile memory controller according to an embodiment of the present inventive concept.

Referring to FIG. 3, the RIO encoder 112 according to an embodiment of the present inventive concept encodes data DATA_A provided from the host 10 into codeword DATA_B which is a binary vector including one or more bits. The non-volatile memory controller 100 may perform bit-to-state mapping on the encoded codeword DATA_B using a predetermined bitmap, to thereby program the codeword DATA_B to the non-volatile memory 200. Then, when there is a request for reading the data stored in the non-volatile memory 200, the non-volatile memory controller 100 reads the non-volatile memory 200 to acquire data DATA_I. The data DATA_I may be decoded by the RIO decoder 114 and provided, for example, to the host 10 or to a user.

In some embodiments of the present inventive concept, the data DATA_A provided from the host 10 may be divided into a plurality of unit data prior to being encoded into the codeword DATA_B. The operation of dividing the data DATA_A provided from the host 10 into a plurality of unit data may be performed by the aforementioned page management unit 108, however, the subject who performs the operation is not limited thereto.

Figure 5:
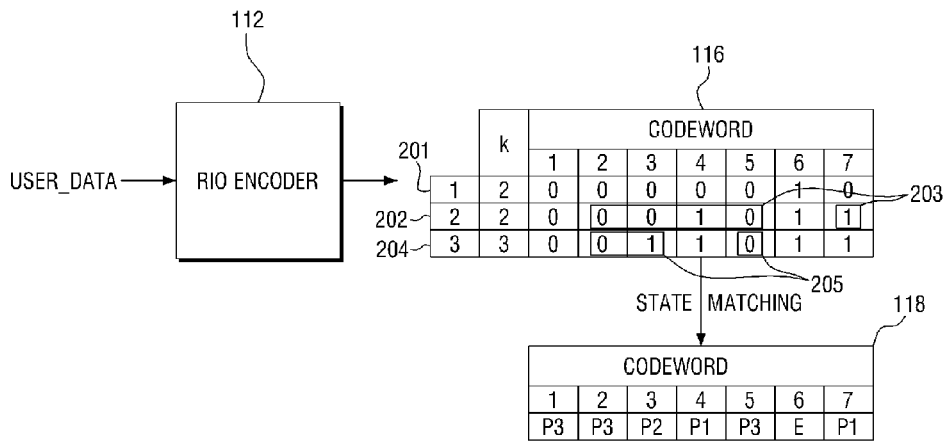
FIG. 5 is a diagram schematically illustrating a data encoding operation of a non-volatile memory controller according to an embodiment of the present inventive concept.

With additional reference to FIG. 5, for example, the data DATA_A provided from the host 10 may be divided into first unit data and second unit data. In this case, the RIO encoder 112 may encode the first unit data into first codewords 201 including n-number of bits (n is an integer equal to or more than 1). Furthermore, the RIO encoder 112 may encode the second unit data into second codewords 203 including n-w number of bits (w is an integer less than n, and equal to or more than 1) corresponding to the bit having a value of 0 among n-number of bits of the first codewords 201. Similarly, if the data DATA_A provided from the host 10 includes third unit data in addition to the first and second unit data, the RIO encoder 112 may encode the third unit data into third codewords 205 including n-w-v number of bits (v is an integer less than w, and equal to or more than 1) corresponding to the bit having a value of 0 among n-w number of bits of the second codewords 203. In some embodiments of the present inventive concept, techniques for encoding the data DATA_A provided from the host 10 may include various techniques such as an enumerative code and an arithmetic code.

The non-volatile memory controller 100 may perform bit-to-state mapping on the thus-encoded first codewords 201 and second codewords 203 using a predetermined bitmap. For example, the bitmap may include bit values related to a first state for a first page of the non-volatile memory 200 and a second state adjacent to the first state. Furthermore, the bitmap may include bit values related to a second state for a second page of the non-volatile memory 200 and a third state adjacent to the second state. In this case, the bit values related to the first state for the first page and the second state may be 1 and 0, respectively, and the bit values related to the second state for the second page and the third state may be 1 and 0, respectively. The non-volatile memory controller 100 may perform bit-to-state mapping using the bitmap including the aforementioned information, thereby programming the first codewords 201 and the second codewords 203 to the non-volatile memory 200.

In various embodiments of the present inventive concept, the total number of pages constituting a bitmap may have a value smaller than the total number of states by 1. For example, when the total number of pages accessed to store data in the non-volatile memory 200 is 4, the total number of states including an erase state (E) may be 5.

Figure 4:
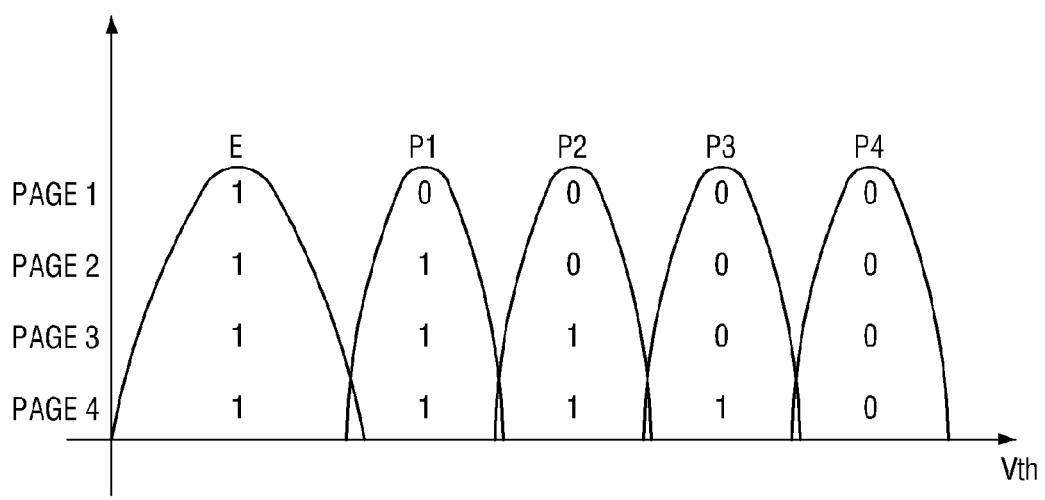
FIG. 4 is a diagram illustrating a distribution of threshold voltages of a multi-level cell (MLC) capable of storing four bits per cell.

FIG. 4 is a diagram illustrating a distribution of threshold voltages of a multi-level cell (MLC) capable of storing four bits per cell. That is, FIG. 4 illustrates a distribution of threshold voltages at program states after executing a program of a $\log_2(5)=2.32$ bit multi-level cell (MLC) non-volatile memory device having five program states and at an erase state. In this case, the X axis denotes a threshold voltage and the Y axis denotes the number of memory cells.

In various embodiments of the present inventive concept, the non-volatile memory 200 has a distribution (P1 to P4) of threshold voltages at five program states and a distribution E of threshold voltages at one erase state in case of 2.32 bit MLC. Each state includes four bits corresponding to the respective four pages. Thus, a bitmap may be formed.

Specifically, the bitmap may include bit values related to the first state E for the first page of the non-volatile memory 200 and related to the second state P1 adjacent to the first state E. Furthermore, the bitmap may include bit values related to the second state P1 for the second page of the non-volatile memory 200 and related to the third state P2 adjacent to the second state P1. In this case, it should be noted that 1 and 0 are separated based on the first state E and the second state P1 adjacent to the first state E on the first page, and 1 and 0 are separated based on the second state P1 and the third state P2 adjacent to the second state P1 on the second page.

In various embodiments of the present inventive concept, the bitmap can be constituted as described above, and bit-to-state mapping is performed on the first codewords 201 and the second codewords 203 using the thus-constituted bitmap, thus restricting read operations to be performed only twice at the maximum when randomly reading the data stored in the non-volatile memory 200. Specifically, a read operation can be performed between the first state and the second state of the non-volatile memory 200 so as to decode second unit data from the first codewords 201 programmed to the first page. In the meantime, a read operation (primary read operation) can be performed between the second state and the third state of the non-volatile memory 200 and then a read operation (secondary read operation) can be performed between the first state and the second state of the non-volatile memory 200 so as to decode second unit data from the second codewords 203 programmed to the second page.

FIG. 5 is a diagram schematically illustrating data encoding operation of a non-volatile memory controller according to an embodiment of the present inventive concept.

Referring to FIG. 5, the RIO encoder 112 according to an embodiment of the present inventive concept encodes data USER_DATA to the first codewords 201, the second codewords 203 and the third codewords 205 each of which is a binary vector including one or more bits.

Referring to FIG. 5, item 'k' of a table 116 is weight to be reflected to an encoding operation, and denotes an upper limit value of the number of bits having a value of 1 on a codeword. In other words, the number of bits having a value of 1 among the first codewords 201 is determined by a predetermined first Hamming weight (k=2), the number of bits having a value of 1 among the second codewords 203 is determined by a predetermined second Hamming weight (k=2), and the number of bits having a value of 1 among the third codewords 205 is determined by a predetermined third Hamming weight (k=3).

In the meantime, referring to FIG. 5, lengths of the first codewords 201, the second codewords 203 and the third codewords 205 are 7, 5 and 3, respectively. Specifically, the data USER_DATA may be divided into the first unit data to the third unit data by the non-volatile memory controller 100, for example, the page management unit 108. The RIO encoder 112 converts the first unit data into a binary vector having a length 7 and weight 2, to thereby generate the first codewords 201 of (0, 0, 0, 0, 0, 1, 0). Subsequently, the RIO encoder 112 converts the second unit data into a binary vector having a length 5 and weight 2, to thereby generate the second codewords 203 of (0, 0, 1, 0, 1).

It should be noted that, in case where the RIO encoder 112 generates the second codewords 203, the RIO encoder 112 generates the second codewords 203 on the positions of the second to fifth bits and the seventh bit corresponding to the bit value of 0 among the first to seventh bits of the first codewords 201. In other words, the second codewords 203 do not include values corresponding to the first bit and the sixth bit of the first codewords 201. Similarly, in case where the RIO encoder 112 generates the third codewords 205, the RIO encoder 112 generates the third codewords 205 on the positions of the second, the third and the fifth bits corresponding to the bit value of 0 among the second to fifth bits and the seventh bit of the second codewords 203.

That is, the RIO encoder 112 generates codewords relevant to the next page only on the position of the bit corresponding to the position having a bit value of 0 among the bits of the codewords relevant to the previous page. Referring to FIG. 5, the bits having a value of 0 are the first to fifth bits and the seventh bit among the first to seventh bits of the first codewords 201 having a length of 7, and when the length of the second codewords 203 is set to 5, the second codewords 203 are generated on the positions of the second to fifth bits and the seventh bit, however, the codewords 203 can be generated, for example, on the positions of the first to fifth bits according to an implementation method.

Bit-to-state mapping can be performed by applying the bitmap to which a bit-state relationship shown in FIG. 4 is reflected, to the thus-generated codeword table 116. For example, a first bit string of the table 116 has a value of (0, 0, 0) in a vertical direction, and the state corresponding thereto in FIG. 4 is P3. Furthermore, a third bit string has a value of (0, 0, 1) in a vertical direction, and the state corresponding thereto in FIG. 4 is P2. Similarly, a sixth bit string has a value of (1, 1, 1) in a vertical direction, and the state corresponding thereto in FIG. 4 is E. As shown in a table 118, the non-volatile memory controller 100 maps states to codewords in the manner described above, to thereby program the first codewords 201, the second codewords 203 and the third codewords 205 to the non-volatile memory 200.

Figure 6:
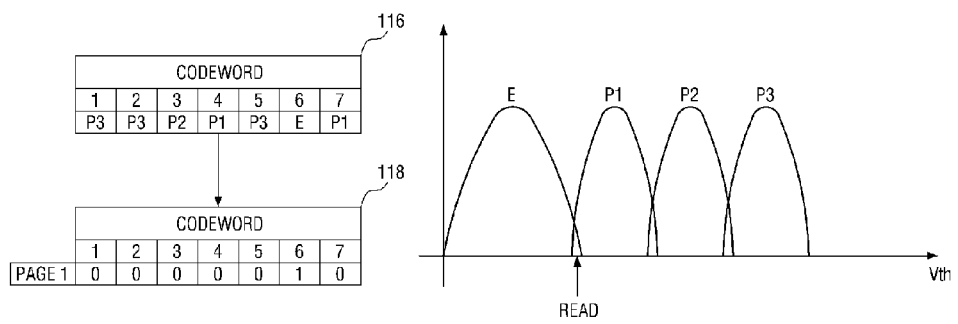
FIGS. 6 to 8 are diagrams schematically illustrating data read operations of a non-volatile memory controller according to an embodiment of the present inventive concept.
Figure 7:
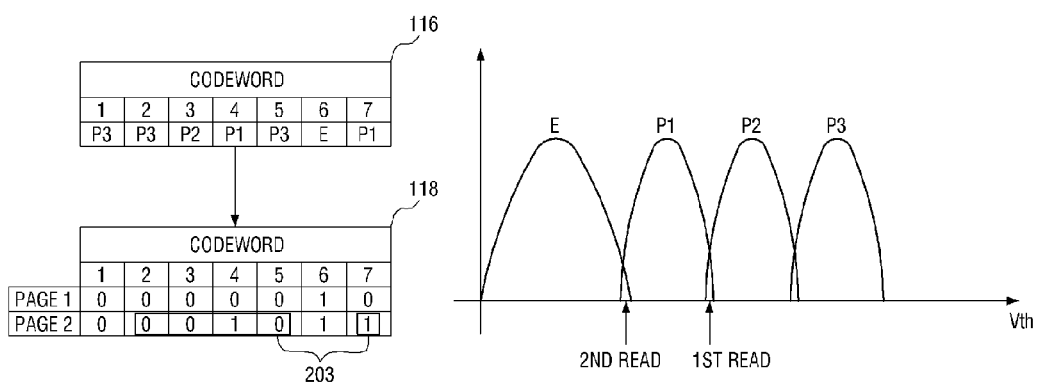
Figure 8:
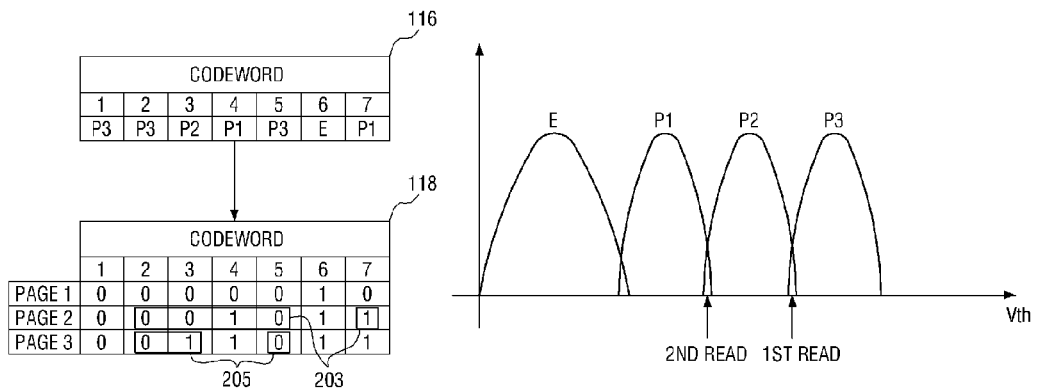

FIGS. 6 to 8 are diagrams schematically illustrating data read operation of a non-volatile memory controller according to an embodiment of the present inventive concept.

Referring to FIG. 6, the non-volatile memory controller 100 according to an embodiment of the present inventive concept reads a first page of the non-volatile memory 200. Specifically, the non-volatile memory controller 100 reads between the first state E and the second state P1 where 1 and 0 are separated for the first page on a bitmap so as to read the first page of the non-volatile memory 200. Thus, the sixth bit E of the table 116 can be converted to 1, and the first to fifth bits and the seventh bit P3, P3, P2, P1, P3 and P1 of the table 116 can be converted to 0. As a result, as shown in the table 118, the first codewords 201 restored for the first page are (0, 0, 0, 0, 0, 1, 0).

Referring to FIG. 7, the non-volatile memory controller 100 according to an embodiment of the present inventive concept reads the second page of the non-volatile memory 200. Specifically, to read the second page of the non-volatile memory 200, the non-volatile memory controller 100 reads (primary read operation) between the second state P1 and the third state P2 where 1 and 0 are separated for the second page on a bitmap, and then, reads (secondary read operation) between the first state E and the second state P1 so as to extract the position of 0 on the previous page (i.e., the first page). Thus, the fourth bit P1, the sixth bit E and the seventh bit P1 of the table 116 can be converted to 1, and the first to third bits and the fifth bit P3, P3, P2 and P3 of the table 116 can be converted to 0. As a result, a second bit string read for the second page becomes (0, 0, 0, 1, 0, 1, 1) as shown in the table 118.

Then, the second codewords 203 are restored from the first codewords 201 and the second bit string. Specifically, to restore the second codewords 203, the five lowest bit positions (i.e., length of the second codewords 203) are selected from among the bit positions corresponding to 0 in the first codewords 201, and bits corresponding to the selected bit positions are extracted from the second bit string. Thus, the second codewords 203 are restored as (0, 0, 1, 0, 1).

Referring to FIG. 8, the non-volatile memory controller 100 according to an embodiment of the present inventive concept reads the third page of the non-volatile memory 200. Specifically, to read the third page of the non-volatile memory 200, the non-volatile memory controller 100 reads (primary read operation) between the third state P2 and the fourth state P3 where 1 and 0 are separated for the third page on a bitmap, and then, reads (secondary read operation) between the second state P1 and the third state P2 so as to extract the position of 0 on the previous page (i.e., the second page). Thus, the third bit P2, the fourth bit P1, the sixth bit E and the seventh bit P1 of the table 116 can be converted to 1, and the first bit, the second bit and the fifth bit P3, P3 and P3 of the table 116 can be converted to 0. As a result, the third bit string read for the third page becomes (0, 0, 1, 1, 0, 1, 1) as shown in the table 118.

Then, the third codewords 205 are restored from the second bit string and the third bit string. Specifically, to restore the third codewords 205, the three lowest bit positions (i.e., the length of the third codewords 205) are selected from among the bit positions corresponding to 0 in the second bit string, and bits corresponding to the selected bit positions are extracted from the third bit string. Thus, the third codewords 205 are restored as (0, 1, 0).

Figure 9:
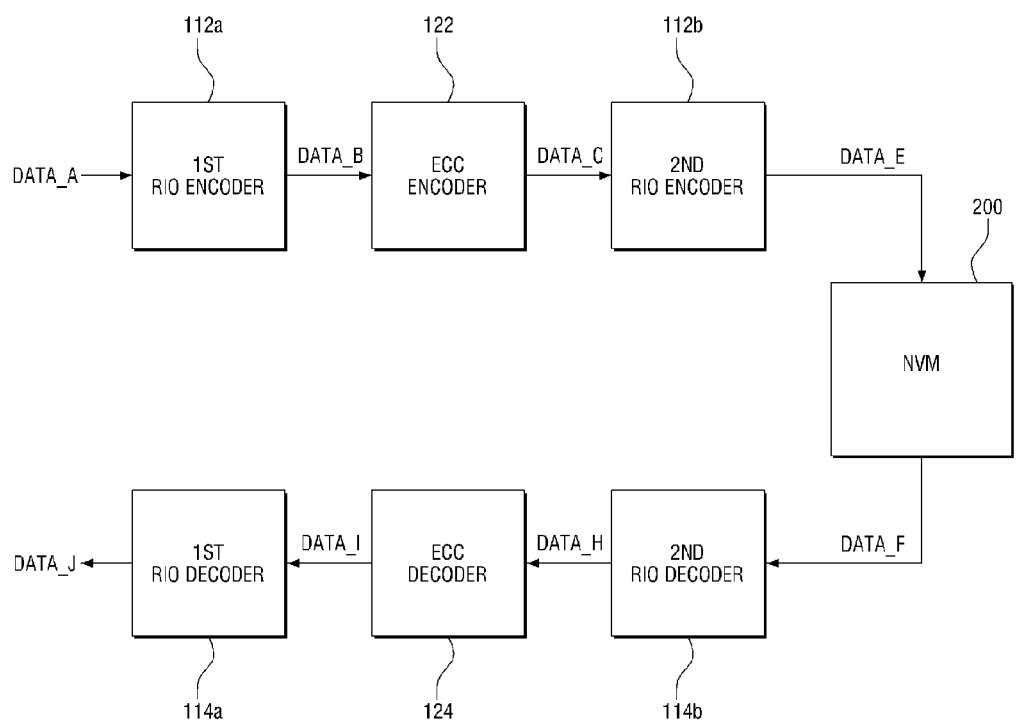
FIG. 9 is a block diagram schematically illustrating a method for operating a non-volatile memory controller according to another embodiment of the present inventive concept.

FIG. 9 is a block diagram schematically illustrating a method for operating a non-volatile memory controller according to another embodiment of the present inventive concept.

Referring to FIG. 9, a first RIO encoder 112*a* encodes the data DATA_A provided from the host 10 into the codeword DATA_B which is a binary vector including one or more bits. The codeword DATA_B is input to the ECC encoder 122 and ECC encoded, and output as an ECC codeword DATA_C including ECC parity. Then, a second RIO encoder 112*b* may perform additional encoding on the ECC parity of the ECC codeword DATA_C, and then may program the resultant data DATA_E to the non-volatile memory 200. In this case, the additional encoding may be performed based on a polar code using various coding techniques such as a write once memory (WOM) code or a linear coset code. In addition, the additional coding may be implemented based on a well-known ECC by applying a coset coding technique. The above-described second RIO code is characterized in that original data can be restored by a bit string alone obtained through read operation performed once.

Upon receipt of a request for reading the data stored in the non-volatile memory 200 thereafter, the non-volatile memory controller 100 reads the non-volatile memory 200 to acquire data DATA_F. A second RIO decoder 114*b* performs decoding on ECC parity of the data DATA_F, and the ECC decoder 124 performs ECC decoding on the resultant data DATA_G, thereby restoring codeword DATA_I where the ECC parity is removed. The data DATA_I may be decoded by the first RIO decoder 114*a*, and then may be provided to, for example, the host 10 or a user.

Figure 10:
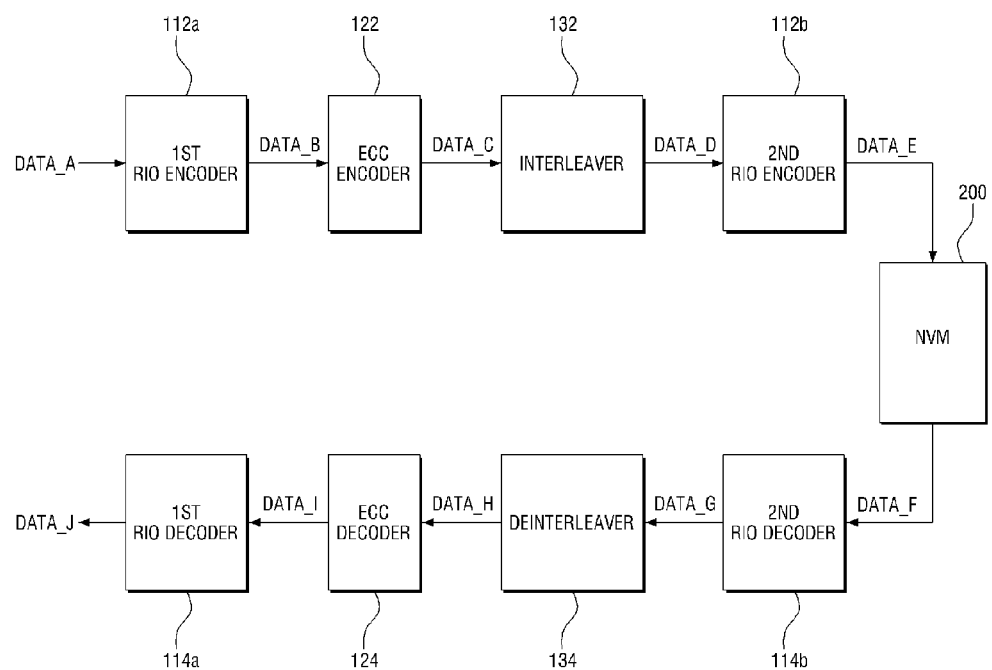
FIG. 10 is a block diagram schematically illustrating a method for operating a non-volatile memory controller according to yet another embodiment of the present inventive concept.

FIG. 10 is a block diagram schematically illustrating a method for operating a non-volatile memory controller according to yet another embodiment of the present inventive concept.

The embodiment described with reference to FIG. 10 differs from the embodiment described with reference to FIG. 9 in that interleaving operation is performed on the ECC parity of the ECC codeword DATA_C output from the ECC encoder 122 prior to performing additional encoding on the ECC parity by the second RIO encoder 112*b*.

Specifically, the first RIO encoder 112*a* encodes the data DATA_A provided from the host 10 into the codeword DATA_B which is a binary vector including one or more bits. The codeword DATA_B is input to the ECC encoder 122 and ECC encoded, and output as the ECC codeword DATA_C including ECC parity. In this case, the ECC codeword DATA_C includes ECC parity. An interleaver 132 outputs data DATA_D to which interleaved ECC parity generated by performing interleaving operation on the ECC parity is added. Then, the second RIO encoder 112*b* may perform additional encoding on the interleaved ECC parity of the data DATA_D, and then may program the resultant data DATA_E to the non-volatile memory 200.

Thereafter, upon receipt of a request for reading the data stored in the non-volatile memory 200, the non-volatile memory controller 100 reads the non-volatile memory 200 to acquire data DATA_F. The second RIO decoder 114*b* performs decoding on ECC parity of the data DATA_F, and the deinterleaver 134 performs deinterleaving operation on the resultant data DATA_G, thereby restoring data DATA_H including the original ECC parity. Then, the ECC decoder 124 performs ECC decoding, thereby restoring codeword DATA_I where the ECC parity is removed. The data DATA_I may be decoded by the first RIO decoder 114*a*, and then may be provided to, for example, the host 10 or a user.

Figure 11:
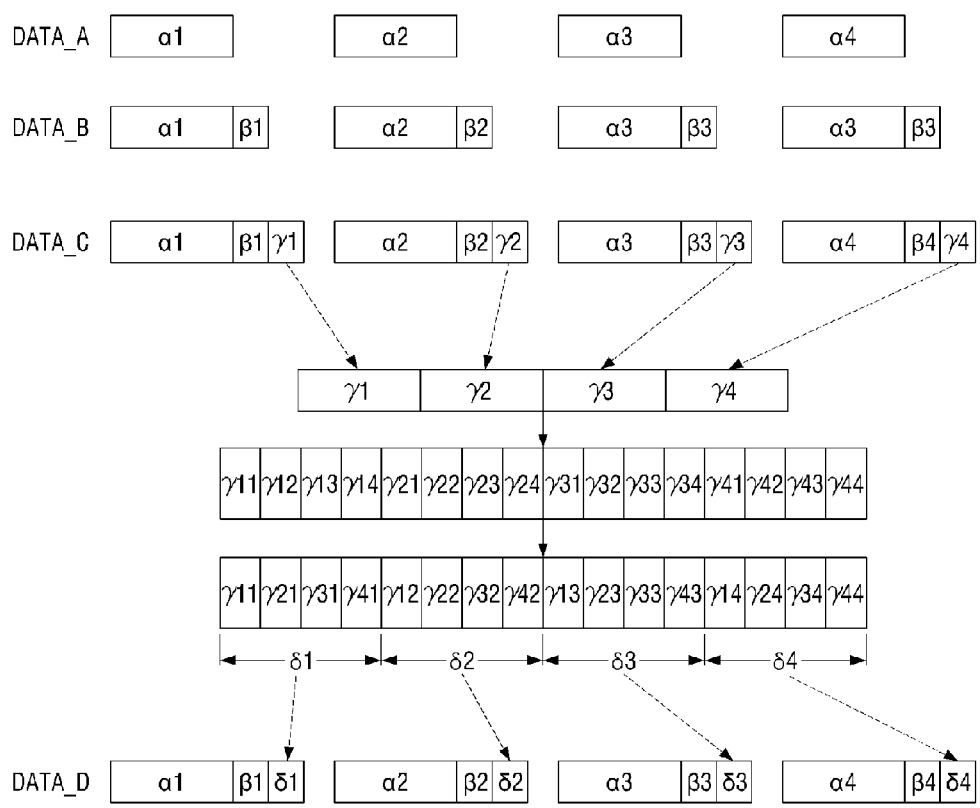
FIG. 11 is a diagram illustrating in detail an interleaving operation of the method for operating the non-volatile memory controller shown in FIG. 10.

FIG. 11 is a diagram illustrating in detail an interleaving operation of the method for operating the non-volatile memory controller shown in FIG. 10.

As described with reference to FIG. 10, the data DATA_A provided from the host 10 is encoded to the codeword DATA_B through the first RIO encoder 112*a*. In this case, the codeword DATA_B includes additional data $\beta 1$, $\beta 2$, $\beta 3$ and $\beta 4$ resulted from a binary vectorization in addition to existing data $\alpha 1$, $\alpha 2$, $\alpha 3$ and $\alpha 4$. The codeword DATA_B is ECC encoded by the ECC encoder 122 and thus converted to the ECC codeword DATA_C including ECC parities $\gamma 1$, $\gamma 2$, $\gamma 3$ and $\gamma 4$.

The interleaver 132 outputs data DATA_D to which interleaved ECC parities $\delta 1$, $\delta 2$, $\delta 3$ and $\delta 4$ generated by performing an interleaving operation on the ECC parities $\gamma 1$, $\gamma 2$, $\gamma 3$ and $\gamma 4$ are added. As shown in FIG. 11, the interleaved ECC parity $\delta 1$ may include ECC parities $\gamma 11$, $\gamma 21$, $\gamma 31$ and $\gamma 41$ which are parts of ECC parities $\gamma 1$, $\gamma 2$, $\gamma 3$ and $\gamma 4$, and the interleaved ECC parity $\delta 2$ may include ECC parities $\gamma 12$, $\gamma 22$, $\gamma 32$ and $\gamma 42$ which are parts of ECC parities $\gamma 1$, $\gamma 2$, $\gamma 3$ and $\gamma 4$.

Upon receipt of a request for reading the data stored in the non-volatile memory 200 thereafter, the deinterleaver 134 may perform deinterleaving operation on the interleave ECC parities $\delta 1$, $\delta 2$, $\delta 3$ and $\delta 4$, to thereby restore data DATA_H including each of the original ECC parities $\gamma 1$, $\gamma 2$, $\gamma 3$ and $\gamma 4$.

Figure 12:
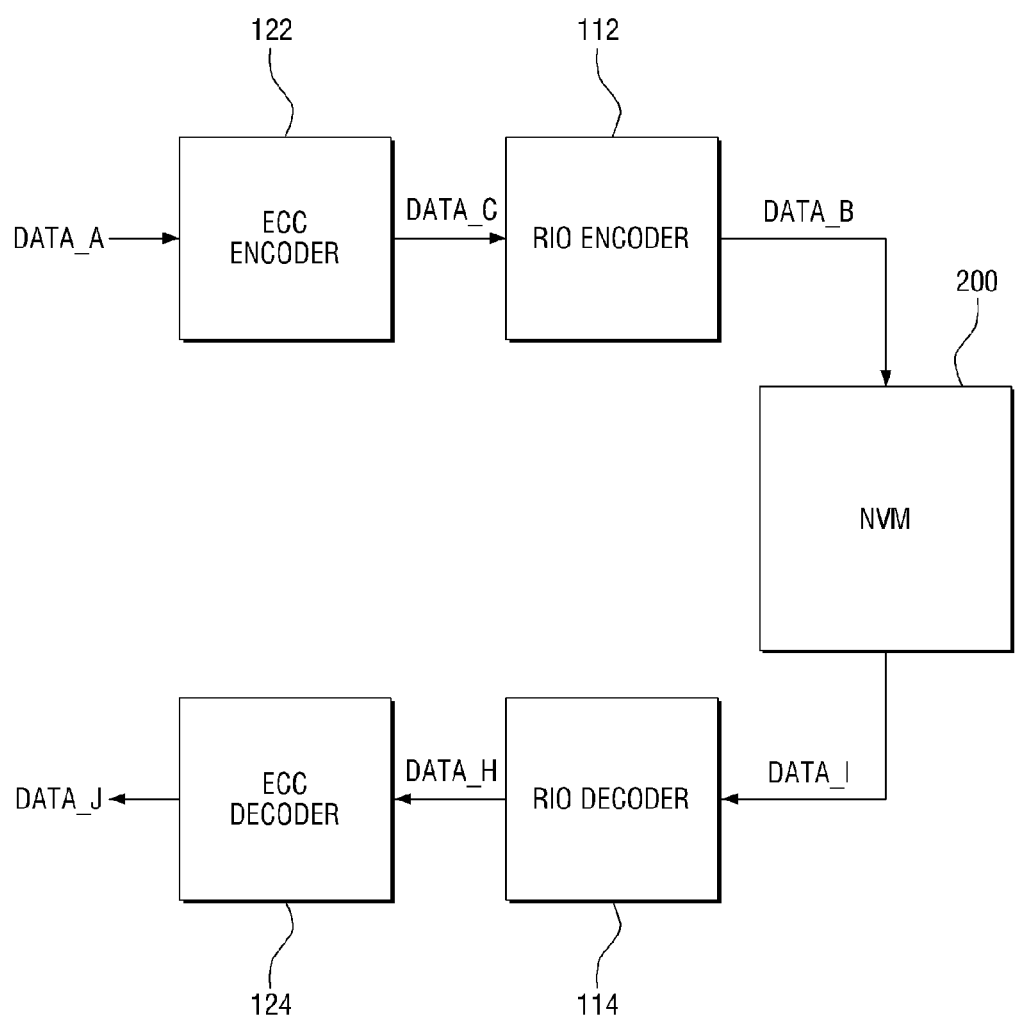
FIG. 12 is a block diagram schematically illustrating a method for operating a non-volatile memory controller according to still another embodiment of the present inventive concept.

FIG. 12 is a block diagram schematically illustrating a method for operating a non-volatile memory controller according to still another embodiment of the present inventive concept.

The embodiment described with reference to FIG. 12 differs from the embodiment described with reference to FIG. 9 in that the data DATA_A provided from the host 10 is ECC encoded by the ECC encoder 122 prior to being encoded to the codeword DATA_B which is a binary vector by the RIO encoder 112. Thus, upon receipt of a request for reading the data stored in the non-volatile memory 200 thereafter, data DATA_I acquired by reading the non-volatile memory 200 may pass through the RIO decoder 114 and then may pass through the ECC decoder 124.

Figure 13:
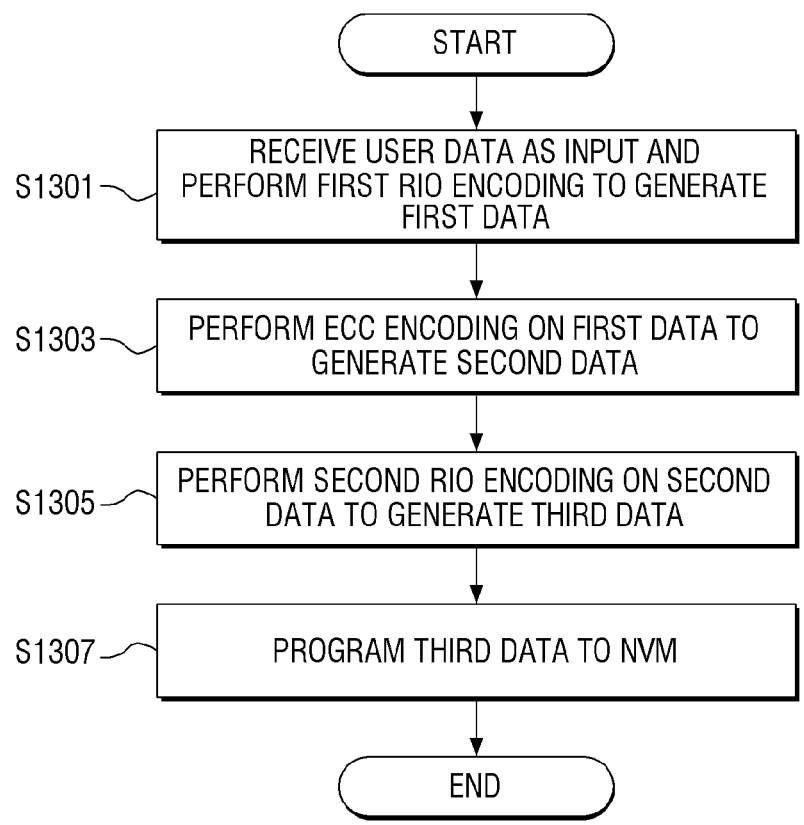
FIG. 13 is a flow chart illustrating a method for operating a non-volatile memory device according to yet still another embodiment of the present inventive concept.

FIG. 13 is a flow chart illustrating a method for operating a non-volatile memory device according to yet still another embodiment of the present inventive concept.

Referring to FIG. 13, a method for operating a non-volatile memory device according to yet still another embodiment of the present inventive concept includes receiving user data and performing bit vector encoding using the first RIO encoder 112*a*, to thereby generate first data including n-number of bits (n is an integer equal to or more than 1) (S1301), performing ECC encoding on the first data, to thereby generate second data including ECC parity (S1303), performing additional encoding (secondary RIO encoding) on the ECC parity of the second data, to thereby generate third data (S1305), and programming the third data to a non-volatile memory (S1307).

Figure 14:
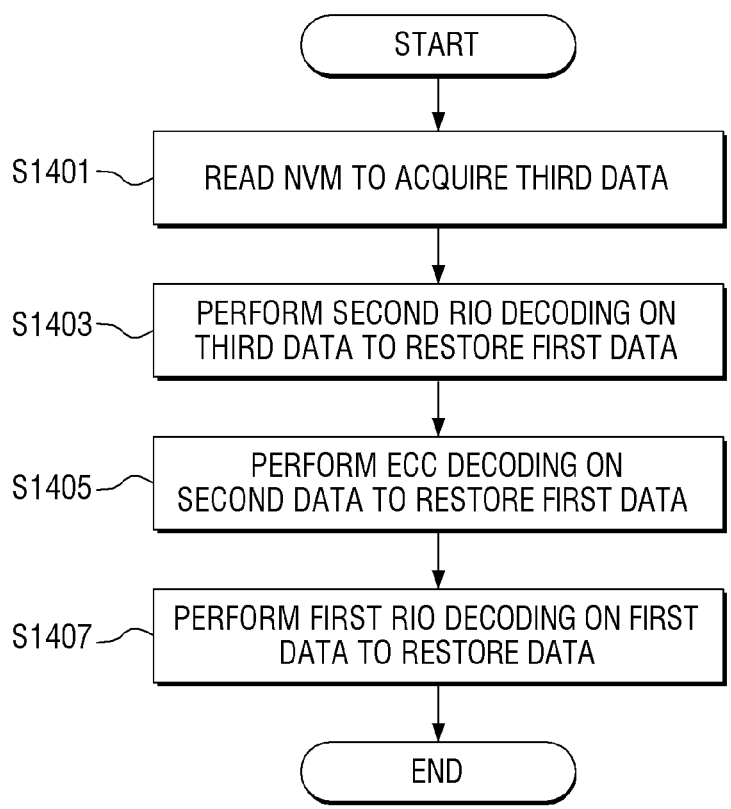
FIG. 14 is a flow chart illustrating a method for operating a non-volatile memory device according to yet still another embodiment of the present inventive concept.

FIG. 14 is a flow chart illustrating a method for operating a non-volatile memory device according to yet still another embodiment of the present inventive concept.

Referring to FIG. 14, a method for operating a non-volatile memory device according to yet still another embodiment of the present inventive concept includes reading the third data from the non-volatile memory 200 (S1401), performing decoding (secondary RIO decoding) on the ECC parity included in the third data, to thereby restore the second data (S1403), performing ECC decoding on the second data, to thereby restore the first data (S1405), and performing bit vector decoding (primary RIO decoding) on the first data, to thereby restore data (S1407).

According to various embodiments of the present inventive concept, read operations required for randomly reading a multi-level cell memory in a manner having a relatively low complexity is restricted to twice at the maximum, thereby significantly increasing, for example, the random I/O speed of a NAND flash memory system and reducing the size of a cell overhead or a hardware. Furthermore, occurrence of errors is suppressed and propagation of errors is minimized by using en ECC engine or an interleaving engine, thus improving reliability of the memory system.

In the meantime, the non-volatile memory devices and the methods for operating the non-volatile memory device according to various embodiments of the present inventive concept described thus far may be applied not only to a planar NAND flash memory but also to a vertical NAND flash memory. In the case of a vertical NAND flash memory, a memory block BLKi described with reference to FIG. 1 may have a three dimensional structure (or a vertical structure) as shown in FIG. 15.

Figure 15:
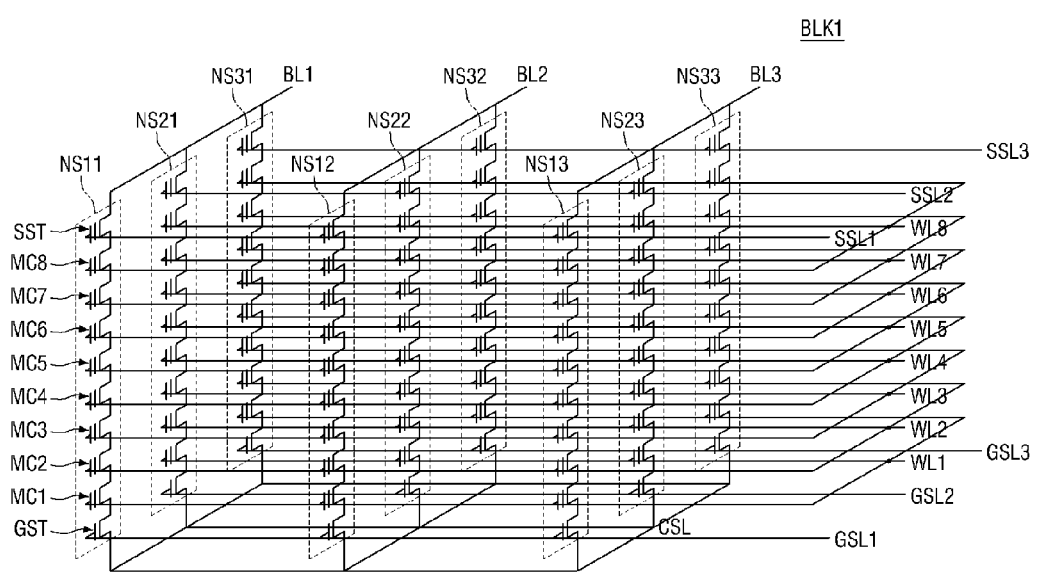
FIG. 15 is a circuit diagram illustrating an equivalent circuit of a memory block described with reference to FIG. 1.

FIG. 15 is a circuit diagram illustrating an equivalent circuit of the memory block BLKi described with reference to FIG. 1. Referring to FIG. 15, NAND strings NS11 to NS31 are provided between a first bit line BL1 and a common source line CSL, NAND strings NS12, NS22 and NS32 are provided between a second bit line BL2 and the common source line CSL, and NAND strings NS13, NS23 and NS33 are provided between a third bit line BL3 and the common source line CSL. Each NAND string NS has a string selection transistor SST connected to a corresponding bit line BL. Each NAND string NS has a ground selection transistor GST connected to a common source line CSL. Memory cells MC are provided between the string selection transistor SST and the ground selection transistor GST of each NAND string NS.

Figure 16:
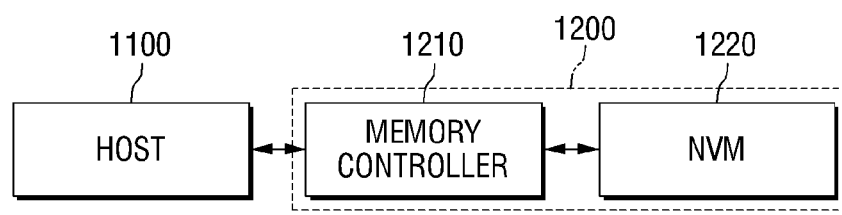
FIG. 16 is a block diagram illustrating a user device including non-volatile memory devices according to some embodiments of the present inventive concept.

FIG. 16 is a block diagram illustrating a user device including non-volatile memory devices according to some embodiments of the present inventive concept.

Referring to FIG. 16, a user device 1000 may include a host 1100, and a data storage device 1200. The host 1100 may be configured to control the data storage device 1200. For example, the host 1100 may include a portable electronic device such as a personal/portable computer, a personal digital assistant (PDA), a portable media player (PMP) and an MP3 player.

The host 1100 and the data storage device 1200 may be interconnected via a standardized interface such as a USB, SCSI, ESDI, SATA, SAS, PCIexpress or an IDE interface. However, an interfacing method for interconnecting the host 1100 and the data storage device 1200 is not limited thereto.

The data storage device 1200 may include a memory controller 1210 and a non-volatile memory device 1220. The memory controller 1210 may control programming/read/erase operations of the non-volatile memory device 1220 in response to a request from the host 1100.

The non-volatile memory device 1220 may be constituted as a plurality of non-volatile memory chips. The plurality of non-volatile memory chips may be configured and operate substantially identically with the non-volatile memory devices according to some embodiments of the present inventive concept.

The data storage device 1200 may be constituted as a semiconductor disk (solid state disk (SSD)). However, it is a merely an example, and the data storage device 1200 may be integrated into a single semiconductor device and constituted as a PC card (a personal computer memory card international association (PCMCIA)), a compact flash card (CF), a smart media card (SM, SMC), a memory stick, a multimedia card (MMC, RS-MMC, MMC-micro), an SD card (SD, miniSD, microSD, SDHC), a universal flash memory device (UFS), and the like.

Figure 17:
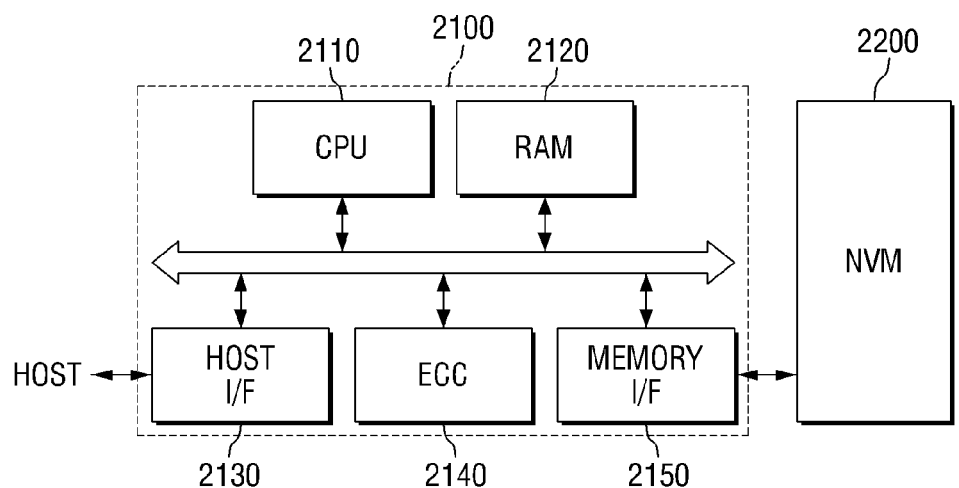
FIG. 17 is a block diagram illustrating an application example of a memory system including non-volatile memory devices according to some embodiments of the present inventive concept.

FIG. 17 is a block diagram illustrating an application example of a memory system including non-volatile memory devices according to some embodiments of the present inventive concept.

Referring to FIG. 17, a memory system 2000 may include a memory controller 2100 and a non-volatile memory device 2200. The memory controller 2100 may control programming/read/erase operation of the non-volatile memory device 2200 in response to a request from a host. The memory controller 2100 may include a CPU 2110, a RAM 2120, a host interface 2130, an error correction block 2140 and a memory interface 2150.

The CPU 2110 may control overall operations of the memory controller 2100. The RAM 2120 may be used as a working memory of the CPU 2110. The host interface 2130 may be interfaced with a host connected to the memory system 2000 to exchange data.

The error correction block 2140 may detect and correct errors of data read from the non-volatile memory device 2200. The memory interface 2150 may be interface with the non-volatile memory device 2200 to exchange data.

The non-volatile memory device 2200 may be constituted as a plurality of non-volatile memory chips. The plurality of non-volatile memory chips may be configured and operate substantially identically with the non-volatile memory devices according to some embodiments of the present inventive concept.

Figure 18:
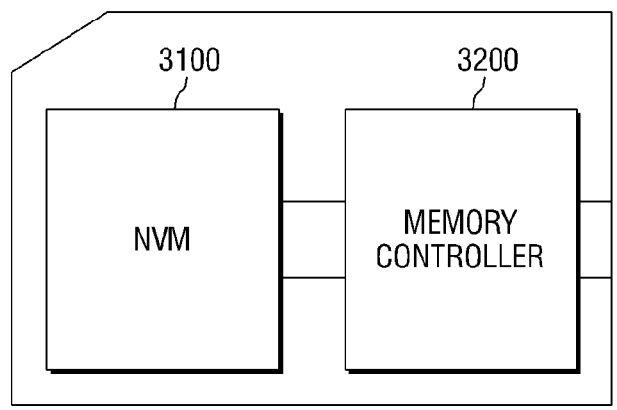
FIG. 18 is a block diagram illustrating a data storage device including non-volatile memory devices according to some embodiments of the present inventive concept.

FIG. 18 is a block diagram illustrating a data storage device including non-volatile memory devices according to some embodiments of the present inventive concept.

Referring to FIG. 18, a data storage device 3000 may include a non-volatile memory device 3100 and a memory controller 3200. The non-volatile memory device 3100 may be constituted as a plurality of non-volatile memory chips. The plurality of non-volatile memory chips may be configured and operate substantially identically with the non-volatile memory devices according to some embodiments of the present inventive concept.

The memory controller 3200 may control programming/read/erase operations of the non-volatile memory device 3100 in response to a request from an external source.

The data storage device 3000 may be constituted as a memory card device, an SSD device, a multimedia card device, an SD device, a memory stick device, a hard disk drive device, a hybrid drive device or a universal serial bus flash device. For example, the data storage device 3000 may be constituted as a card for using a user device such as a digital camera and a personal computer.

Figure 19:
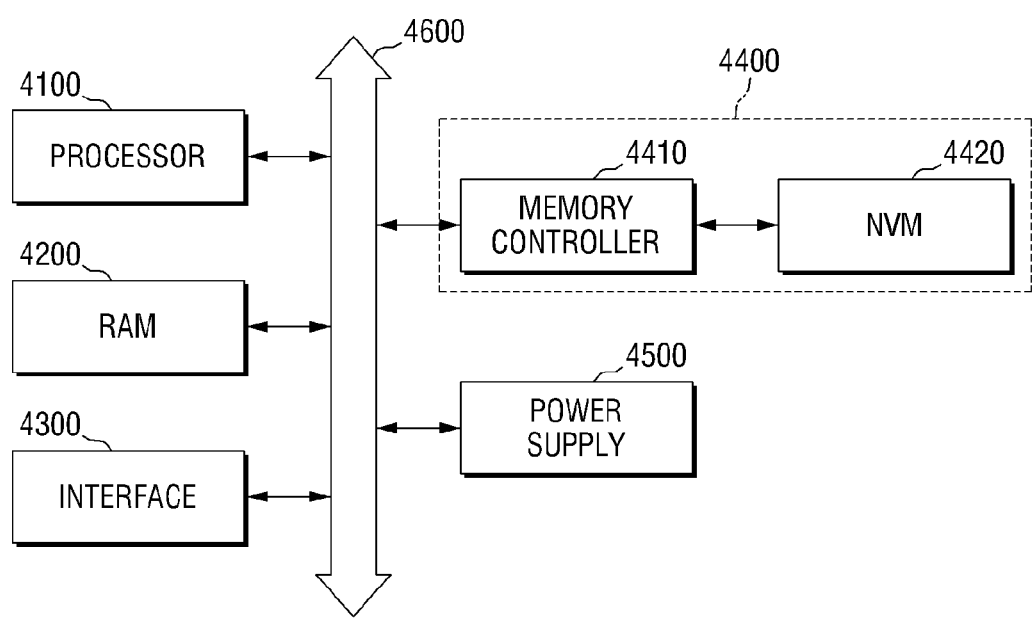
FIG. 19 is a block diagram illustrating a computing system including non-volatile memory devices according to some embodiments of the present inventive concept.

FIG. 19 is a block diagram illustrating a computing system including non-volatile memory devices according to some embodiments of the present inventive concept.

Referring to FIG. 19, a computer system 4000 may include a processor 4100, a RAM 4200, an interface device 4300, a memory system 4400, a power supply 4500 and a bus 4600.

The processor 4100, the RAM 4200, the interface device 4300, the memory system 4400 and the power supply 4500 can be combined with each other via the bus 4600. The bus 4600 may serve as a path for movement of data.

The processor 4100 may include at least one of a microprocessor, a digital signal processor, a microcontroller and logic elements capable of performing functions similar to those of the microprocessor, the digital signal processor and the microcontroller.

The RAM 4200 may be used as a working memory for improving the performance of the processor 4100. The interface device 4300 may transmit data to a communication network or receive data from the communication network.

The interface device 4300 may be of a wired or wireless type. For example, the interface device 4300 may include an antenna, a wired/wireless transceiver, or the like.

The memory system 4400 may store data and/or commands and the like. The memory system 4400 may include a memory controller 4410 and a non-volatile memory device 4420.

The memory controller 4410 may control programming/read/erase operation of the non-volatile memory device 4420. The non-volatile memory device 3100 may be constituted as a plurality of non-volatile memory chips. The plurality of non-volatile memory chips may be configured and operate substantially identically with the non-volatile memory devices according to some embodiments of the present inventive concept.

The power supply 4500 may supply power for operating the processor 4100, the RAM 4200, the interface device 4300 and the memory system 4400.

The computing system 4000 can be applied to a personal digital assistance (PDA), a portable computer, a web tablet, a wireless phone, a mobile phone, a digital music player, a memory card, or all electronic products capable of transmitting and/or receiving information in a wireless environment.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A method for operating a non-volatile memory controller, the method comprising:
    dividing data provided from a host into first unit data and second unit data;
    encoding the first unit data into first codewords including n number of bits (n is an integer equal to or more than 1);
    encoding the second unit data into second codewords including n-w number of bits (w is an integer less than n and equal to or more than 1) corresponding to a bit having a value of 0 among the n number of bits of the first codewords;
    performing bit-to-state mapping on the first codewords and the second codewords using a predetermined bitmap; and
    programming the first codewords and the second codewords to a first page and a second page of a non-volatile memory, respectively.

2. The method of claim 1, further comprising:
    decoding the first codewords and the second codewords programmed to the first page and the second page, respectively, using the predetermined bitmap.

3. The method of claim 1, wherein the predetermined bitmap includes bit values related to a first state for the first page and a second state adjacent to the first state, and bit values related to a second state for the second page and a third state adjacent to the second state; and wherein the bit values related to the first state for the first page and the second state are 1 and 0, respectively, and the bit values related to the second state for the second page and the third state are 1 and 0, respectively.

4. The method of claim 3, further comprising;
    reading between the first state and the second state of the non-volatile memory so as to decode the second unit data from the first codewords programmed to the first page.

5. The method of claim 3, further comprising:
    reading between the second state and the third state of the non-volatile memory and then reading between the first state and the second state of the non-volatile memory so as to decode the second unit data from the second codewords programmed to the second page.

6. The method of claim 1, wherein the number of bits having a value of 1 among the first codewords is determined by a predetermined first Hamming weight, and the number of bits having a value of 1 among the second codewords is determined by a predetermined second Hamming weight.

7. The method of claim 1, wherein programming the first codewords and the second codewords to a first page and a second page of a non-volatile memory, respectively, further includes programming first error correction code (ECC) codewords and second ECC codewords obtained by performing ECC encoding on each of the first codewords and the second codewords to the first page and the second page, respectively.

8. The method of claim 7, wherein programming first error correction code (ECC) codewords and second ECC codewords obtained by performing ECC encoding on each of the first codewords and the second codewords to the first page and the second page, respectively, includes performing additional encoding on each ECC parity of the first ECC codewords and the second ECC codewords, and then programming the first ECC codewords and the second ECC codewords to the first page and the second page, respectively.

9. The method of claim 8, wherein performing additional encoding on each ECC parity of the first ECC codewords and the second ECC codewords, and then programming the first ECC codewords and the second ECC codewords to the first page and the second page, respectively, includes:
    performing interleaving operation on the ECC parity of the first ECC codewords and the ECC parity of the second ECC codewords to thereby generate first interleaved ECC parity and second interleaved ECC parity; and
    performing additional encoding on the first interleaved ECC parity and the second interleaved ECC parity.

10. The method of claim 1, wherein encoding the first unit data and the second unit data into the first codewords and the second codewords includes performing ECC encoding on each of the first unit data and the second unit data to obtain ECC-encoded first unit data and ECC-encoded second unit data, and then encoding the ECC-encoded first unit data and the ECC-encoded second unit data.

11. A method for operating a non-volatile memory controller, comprising:
    dividing data provided from a host into first unit data and second unit data;
    programming the first unit data to a first page of a non-volatile memory; and
    programming the second unit data to a second page of the non-volatile memory;

wherein the second unit data is programmed to a position in the second page corresponding to the position of the first unit data having a value of 0 among the first unit data programmed to the first page, and wherein programming the first unit data to a first page of a non-volatile memory further includes performing bit-to-state mapping on the first unit data using a predetermined bitmap; and wherein programming the second unit data to a second page of the non-volatile memory further includes performing bit-to-state mapping on the second unit data using the predetermined bitmap.

12. The method of claim 11, wherein programming the first unit data to a first page of a non-volatile memory includes encoding the first unit data into first codewords including n number of bits (n is an integer equal to or more than 1) and programming the first codewords to the first page; and wherein programming the second unit data to a second page of the non-volatile memory includes encoding the second unit data into second codewords including n-w number of bits (w is an integer less than n and equal to or more than 1) corresponding to a bit having a value of 0 among the n number of bits of the first codewords and programming the second codewords to the second page.

13. The method of claim 12, wherein the second codewords are programmed to a position in the second page corresponding to the position of the first codeword having a value of 0 among the first codewords programmed to the second page.

14. The method of claim 11, wherein the predetermined bitmap includes bit values related to a first state for the first page and a second state adjacent to the first state, and bit values related to a second state for the second page and a third state adjacent to the second state; and wherein the bit values related to the first state for the first page and the second state are 1 and 0, respectively, and the bit values related to the second state for the second page and the third state are 1 and 0, respectively.

15. A method for operating a non-volatile memory controller, comprising:

receiving user data and performing bit vector encoding to generate first data including n number of bits (n is an integer equal to or more than 1);

performing ECC encoding on the first data to generate second data including ECC parity;

performing additional encoding on the ECC parity of the second data to generate third data;

performing bit-to-state mapping on the first data using a predetermined bitmap, and programming the first data and the third data to a non-volatile memory, wherein performing bit vector encoding includes encoding original data to a bit vector in which the number of bits having a value of 1 does not exceed predetermined weight.

16. The method of claim 15, further comprising:

dividing the user data into first unit data and second unit data, wherein generating first data includes:

encoding the first unit data into first codewords including n number of bits (n is an integer equal to or more than 1);

encoding the second unit data into second codewords including n-w number of bits (w is an integer less than n and equal to or more than 1) corresponding to a bit having a value of 0 among the n number of bits of the first codewords; and generating the first codewords and the second codewords as the first data.

17. The method of claim 15, further comprising:

reading the third data from the non-volatile memory;

performing decoding on ECC parity included in the third data to restore the second data;

performing ECC decoding on the second data to restore the first data; and performing bit vector decoding on the first data to restore the data.

* * * * *